(12) United States Patent
Kumar et al.

(10) Patent No.: US 9,660,416 B2
(45) Date of Patent: May 23, 2017

(54) ANTENNA FEEDBACK SCHEME FOR ACHIEVING NARROW BEAM EMISSION FROM PLASMONIC LASERS

(71) Applicant: LEHIGH UNIVERSITY, Bethlehem, PA (US)

(72) Inventors: Sushil Kumar, Center Valley, PA (US); Chongzhao Wu, Bethlehem, PA (US)

(73) Assignee: Lehigh University, Bethlehem, PA (US)

( * ) Notice: Subject to any disclaimer, the term of this patent is extended or adjusted under 35 U.S.C. 154(b) by 0 days.

(21) Appl. No.: 14/984,652

(22) Filed: Dec. 30, 2015

(65) Prior Publication Data

US 2016/0190768 A1 Jun. 30, 2016

Related U.S. Application Data

(60) Provisional application No. 62/097,886, filed on Dec. 30, 2014.

(51) Int. Cl.
*H01S 5/12* (2006.01)
*H01S 5/10* (2006.01)
*H01S 5/34* (2006.01)

(52) U.S. Cl.
CPC .............. *H01S 5/12* (2013.01); *H01S 5/1046* (2013.01); *H01S 5/3402* (2013.01); *H01S 2302/02* (2013.01)

(58) Field of Classification Search
CPC .......... H01S 5/12; H01S 5/1046; H01S 5/3402
See application file for complete search history.

(56) References Cited

U.S. PATENT DOCUMENTS

2010/0129085 A1* 5/2010 Smolyaninov ....... G02B 6/1226
398/141
2013/0266034 A1 10/2013 Yu

OTHER PUBLICATIONS

S. Kumar, et al., "Surface-emitting distributed feedback terahertz quantum-cascade lasers in metal-metal waveguides," Opt. Express, vol. 15, No. 1, Jan. 8, 2007, pp. 113-128.
M.L. Amanti, et al., "Low divergence single-mode terahertz quantum cascade laser," Nature Photonics, vol. 3, Sep. 27, 2009, pp. 586-590.
Y. Chassagneux, et al., "Electrically pumped photonic-crystal terahertz lasers controlled by boundary conditions," Nature, vol. 457, Jan. 8 2009, pp. 174-178.

* cited by examiner

*Primary Examiner* — Dung Nguyen
(74) *Attorney, Agent, or Firm* — Saul Ewing LLP (57) ABSTRACT

A distributed antenna-coupling feedback scheme and specially designed distributed feedback (DFB) metallic cavity and grating for laser application and in particular to plasmonic lasers ensuring a predesigned phase condition such that a mode traveling inside a waveguide is coupled/phase-locked to a mode traveling on the top metal improving the beam quality of the laser.

15 Claims, 12 Drawing Sheets

PRIOR ART

PRIOR ART

FIG. 1C

PRIOR ART

FIG. 4A longitudinal loss sections
lateral loss sections

FIG. 7B 70 μm width, Λ = 21 μm

FIG. 7C 100 μm width, Λ = 21 μm

FIG. 7D 100 μm width, Λ = 24 μm

ANTENNA FEEDBACK SCHEME FOR ACHIEVING NARROW BEAM EMISSION FROM PLASMONIC LASERS

CROSS-REFERENCE TO RELATED APPLICATIONS

This application claims the benefit of U.S. Provisional Application No. 62/097,886, filed Dec. 30, 2014, which is fully incorporated herein by reference.

STATEMENT REGARDING FEDERALLY SPONSORED RESEARCH OR DEVELOPMENT

This invention was made with government support under Contract No. ECCS-1128562 awarded by the National Science Foundation. The government has certain rights in the invention.

FIELD OF INVENTION

In general, the invention relates to lasers and laser systems. In more detail, the invention relates to plasmonic lasers and laser distributed-feedback techniques. In particular, a plasmonic laser incorporating an antenna feedback scheme is described, which improves the beam quality of the plasmonic laser.

BACKGROUND

Nanoscale semiconductor lasers are poised to become the driving force toward achieving dense integration of photonic components on a semiconductor chip for future on-chip photonic sensing and communication capabilities. Miniaturization of photonic components is likely to have a huge commercial impact and will present many future directions for the field of optoelectronics.

A plasmonic laser is a type of laser that confines light at a sub-wavelength scale by storing some of the light energy through electron oscillations referred to as surface plasmon polaritons ("SPPs"). Plasmonic lasers are lasers that lead to stimulated emission of SPPs. Plasmonic lasers are sometimes referred to as SPASERs ("Surface Plasmon Amplification by Stimulated Emission of Radiation"). Quantum cascade lasers ("QCLs") are nanostructured semiconductor lasers that emit in the mid- to far-infrared portion of the electromagnetic spectrum. (QCLs relate to the gain medium used.) Unlike typical interband semiconductor lasers that emit electromagnetic radiation through the recombination of electron-hole pairs across the material band gap, QCLs are unipolar and laser emission is achieved through the use of intersubband transitions in a repeated stack of semiconductor multiple quantum well heterostructures.

Metal-cavity (also referred to as metal-clad or metallic) semiconductor lasers are a type of plasmonic laser that incorporate metallic cladding surrounding the semiconductor gain medium and are the most promising types of nanoscale lasers at near-infrared wavelengths today. Such lasers will be useful for achieving dense integration of photonic components on a semiconductor chip for future on-chip photonic sensing and communication capabilities.

Metallic cavities are also utilized for the best performing semiconductor lasers at far-infrared wavelengths (also known as terahertz or THz frequencies). In this wavelength range, terahertz/THz quantum cascade lasers (QCLs) are by far the best performing lasers compared with other types of compact sources of far-infrared (or THz) radiation. These types of lasers are relatively new, but recent progress in their development have brought them tantalizingly close to commercial applications in the area of terahertz sensing, imaging, and spectroscopy. THz metal-clad QCLs are plasmonic lasers that have potential applications in biological and medical sciences, security screening, illicit material detection, non-destructive evaluation, astrophysics and atmospheric science, manufacturing and process control, communications and ultrafast spectroscopy.

Metal-clad semiconductor lasers operate by confining light at sub-wavelength dimensions thereby storing some of the light energy through electron oscillations called surface plasmon polaritons ("SPPs"). At least one metal surface is required in order to generate and sustain SPPs in the laser's cavity.

Metallic cavities supporting SPP modes have been used to realize nanoscale plasmonic lasers (or "spasers") for potential applications in integrated optics. Such cavities are also used for THz QCLs to achieve low-threshold and high-temperature performance. The most common type of plasmonic lasers with long-range SPPs, which include THz QCLs, utilize Fabry-Pérot type cavities in which at least one dimension is longer than the wavelength inside the dielectric medium of the cavity. A common challenge for all such plasmonic lasers (regardless of the wavelength of their operation) is the poor coupling of SPP modes in the cavity to free-space radiation, which results in highly divergent radiation and poor radiative efficiency from the plasmonic laser. Cavities with periodic photonic structures and broad-area emission are therefore used for narrow-beam emission. However, Fabry-Pérot cavity structures with sub-wavelength apertures are more desirable, especially for electrically pumped plasmonic lasers, which have highly divergent beams.

Distributed feedback ("DFB") is a technique often applied to semiconductor lasers in order to obtain optical emission at a single frequency (i.e., in a single-spectral mode). DFB lasers use one- or multi-dimensional interference gratings in order to provide optical feedback for the laser by the mechanism of Bragg scattering.

Figure 1A:
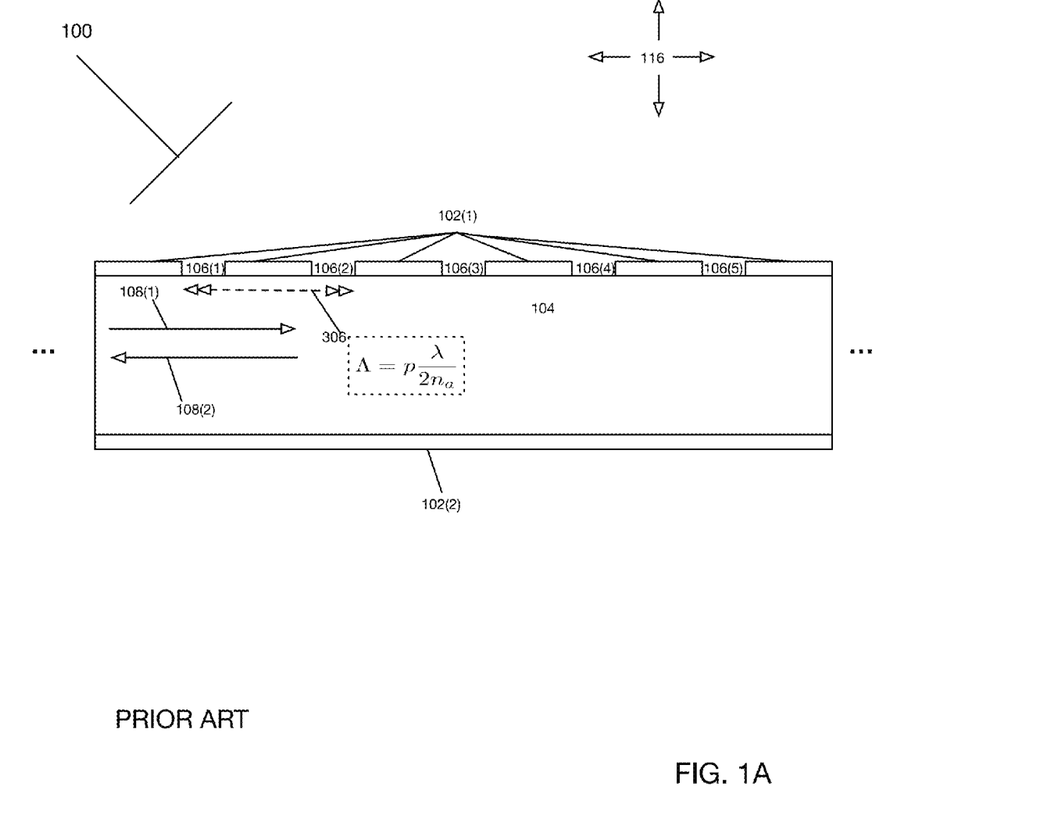
FIG. 1A, which is prior art, shows an example of a periodic grating in the top metal cladding of the cavity of a plasmonic laser, in which p-th order distributed-feedback ("DFB") can be implemented by choosing the appropriate periodicity. The illustration is for a specific type of plasmonic laser that utilizes metal claddings on both sides of the dielectric gain (active) medium forming a "parallel-plate" metallic cavity.

FIG. 1A, which is prior art, shows an example of a periodic grating implemented in the top metal cladding of a parallel-plate metallic cavity that could be utilized to implement p-th order DFB (where p is an integer) in the cavity by choosing the appropriate periodicity. Metal-clad DFB laser 100 comprises cladding 102(1) and cladding 102(2) and apertures 106(1)-106(5) in cladding 102(1). Cladding 102(1) and 102(2) is typically composed of a metallic material. Metal-clad DFB laser 100 is embedded in surrounding medium 116.

Figure 1B:
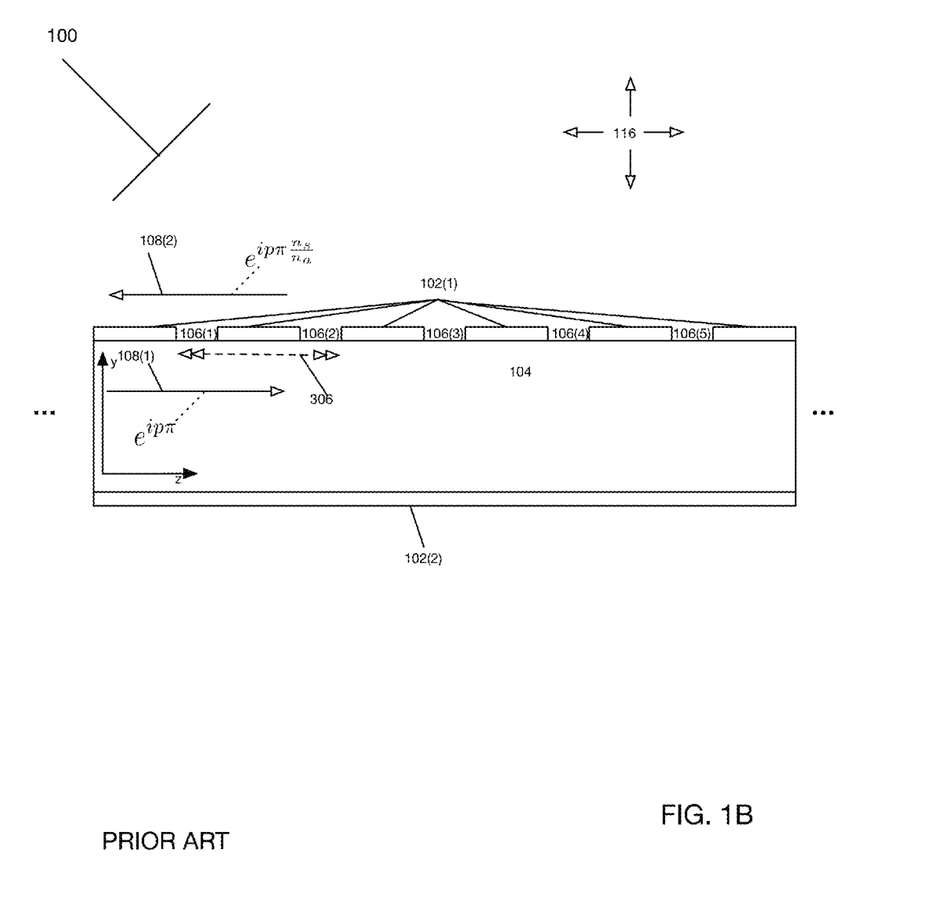
FIG. 1B, which is prior art, illustrates phase-mismatch between successive apertures for SPP waves on either side of a metal cladding of a parallel-plate cavity that could be utilized to implement p-th order DFB by choosing the appropriate periodicity.

FIG. 1B, which is prior art, illustrates phase-mismatch between successive grating apertures for SPP waves on either side of the metal cladding of a metal-clad cavity that could be utilized to implement p-th order DFB by choosing the appropriate periodicity. As shown in FIG. 1B, the guided SPP wave 108(1) inside the optical cavity 104 diffracts out through apertures 106(1)-106(5) and generates single-sided SPP waves 108(2) that are supported by the cladding 102(1) in surrounding medium 116. Phase mismatch (phase change of $$(e^{ip\pi} \text{ vs. } e^{ip\pi \frac{n_s}{n_a}})$$

for propagation length of one grating period) is exhibited between SPP waves on either side of metal cladding in which the grating is implemented, i.e., 108(1) and 108(2) respectively. Here, $n_s$ is the propagation index of the guided SPP wave in the surrounding medium (which is approximately equal to the refractive index of the surrounding medium), and $n_a$ is the propagation index of the guided SPP wave inside the metallic cavity (which is approximately equal to the refractive index of the dielectric medium, also referred to as the active or the gain medium, inside the cavity).

Figure 1C:
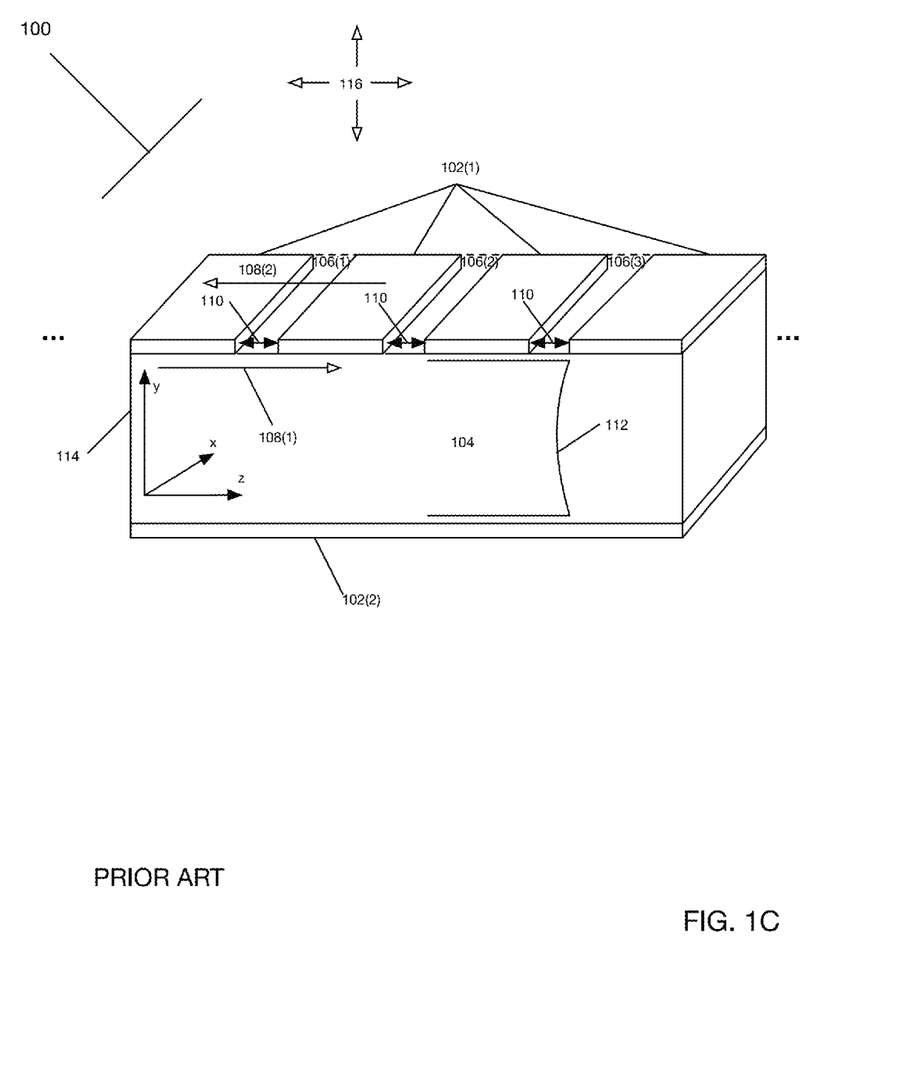
FIG. 1C, which is prior art, shows a portion of a metal-clad plasmonic laser incorporating DFB.

FIG. 1C, which is prior art, shows a portion of a metal-clad plasmonic laser incorporating DFB. As a result of the phase mismatch illustrated in FIG. 1B, a coherent single-sided SPP wave 108(2) in surrounding medium 116 cannot be sustained due to destructive interference with guided SPP wave 108(1) inside the optical cavity 104.

Applicant has identified significant shortcomings with conventional approaches to plasmonic lasers. Because plasmonic lasers emit radiation in multiple directions (i.e. highly divergent radiation), they exhibit very poor beam quality. In particular metal cavity semiconductor lasers suffer from poor beam quality (beam spread) due to sub-wavelength dimensions of the radiating apertures in the metallic cavity. This arises due to divergence effects generated by diffraction. In general, single-mode, low divergence and high power emission is difficult to realize when a laser cavity is of sub-wavelength dimensions. This is true for many types of nanocavity and microcavity lasers such as THz QCLs and limits their practicability. Current THz semiconductor lasers suffer from poor beam quality and highly divergent beams (divergence angle of more than 90 degrees) due to the sub-wavelength dimensions of the apertures in Fabry-Perot type metal cavities. There exist several approaches of implementing DFB, which can improve the beam quality of single-mode THz semiconductor lasers including second-order and third-order DFB methods and two-dimensional photonic-crystal structures. Other techniques may also be applied such as plasmonic collimation with periodic photonic structures that are implemented outside of the lasing cavity. However, all of these conventional approaches exhibit various disadvantages.

Plasmonic lasers with second-order DFB can only achieve a narrow beam pattern in one direction whereas the beam is divergent in the other direction (see, for example, Fan et al. Optics Express v. 14, p. 11672 (2006), Kumar et al. Optics Express v. 15, p. 113 (2007), and Sirtori et al. Nature Photonics v. 7, p. 691 (2013)). Such beams are not suitable for most applications. This is true for plasmonic lasers with practical cavity dimensions in which the laser cavity is kept narrow to keep the pump power small and to maintain good heat-extraction from the laser, such that continuous-wave ("cw") operation could be achieved.

Plasmonic lasers with third-order DFB (Amanti et al. Nature Photonics v. 3, p. 586 (2009)) can achieve narrow-beam emission when the propagation index of the SPP wave inside the cavity $n_a \approx 3$. For THz QCLs this so-called phase-matching condition can be satisfied by a complex deep etching technique to lower the original refractive index of the active region to achieve a narrow beam output (Kao et al. Optics Letters v. 37, p. 2070 (2012), Hu et al. U.S. Pat. No. 9,036,674 B2 (2015)). Furthermore, there exist fabrication challenges with a third-order DFB scheme in achieving a desired phase-matching condition, which may not be precisely satisfied due to the dependence of the phase-matching condition on the lasing frequency. Another disadvantage of the third-order DFB scheme as opposed to the antenna feedback scheme is that output power is lower in the former due to inefficient radiative outcoupling.

With plasmonic or meta-material collimators (Yu et al. Nature Materials v. 9, p. 730 (2010), Liang et al. Scientific Reports v. 4, p. 7083 (2014)), a large area of the semiconductor substrate is utilized for collimation of radiated power from a single laser ridge and hence this scheme is not appropriate for multiple lasers on a single chip. Also, this scheme has only been demonstrated for multi-mode lasers, and will lead to additional challenges when implemented for single-mode plasmonic lasers.

Plasmonic lasers with multi-dimensional photonic crystal structures suffer from requiring a large two-dimensional surface area for emission to achieve a narrow beam output (Chassagneux et al. Nature v. 457, p. 174 (2009), Halioua et al. Optics Letters v. 39, p. 3962 (2014)). A large surface-area laser suffers from temperature degradation in continuous-wave ("cw") operation of the laser due to inefficient heat removal from the laser cavity during operation.

SUMMARY OF INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

A plasmonic laser is described comprising an optical cavity enclosed in a surrounding medium, a metallic cladding surrounding the optical cavity, an optical gain medium enclosed in the cavity and a periodic structure implemented in at least one of the cladding and the optical cavity, wherein the periodic structure is determined from a phase match condition such that upon pumping of the gain medium a coupling is established between a first guided electromagnetic wave in the optical cavity and a second guided electromagnetic wave in the surrounding medium.

A method for generating a narrow beam in a plasmonic laser is described comprising introducing a periodic structure determined from a phase match condition in a boundary separating an optical cavity and a surrounding medium and pumping an optical cavity of the plasmonic laser.

A method for generating a narrow far-field beam using a plasmonic laser is described comprising establishing a coupling between a first guided SPP wave within a medium surrounding the plasmonic laser and a second guided SPP wave inside an optical cavity of the plasmonic laser, wherein the first guided SPP wave exhibits a broad spatial extent such that the far-field beam pattern is correspondingly narrow.

BRIEF DESCRIPTION OF DRAWINGS

FIG. 3A1 and FIG. 3A2 illustrate a cross-section of a portion of a plasmonic laser that incorporates a feedback scheme herein referred as an "antenna feedback" according to one embodiment.

DETAILED DESCRIPTION

Applicants have developed a technique for implementing distributed feedback ("DFB") in a plasmonic laser's cavity referred to herein as "antenna-feedback", which allows the laser to emit at a single frequency as an end-fire phased-array antenna, much like radio or microwave frequency phased-array antennas. The technique is independent of the operating wavelength of the laser and can be implemented in a simple manner with existing lithography techniques for fabrication of plasmonic lasers. With antenna-feedback, a metallic (or metal-clad) laser can be designed to emit laser radiation in an ultra-narrow beam, which is otherwise very difficult to achieve for such lasers because of the sub-wavelength dimensions of their cavities.

Figure 2:
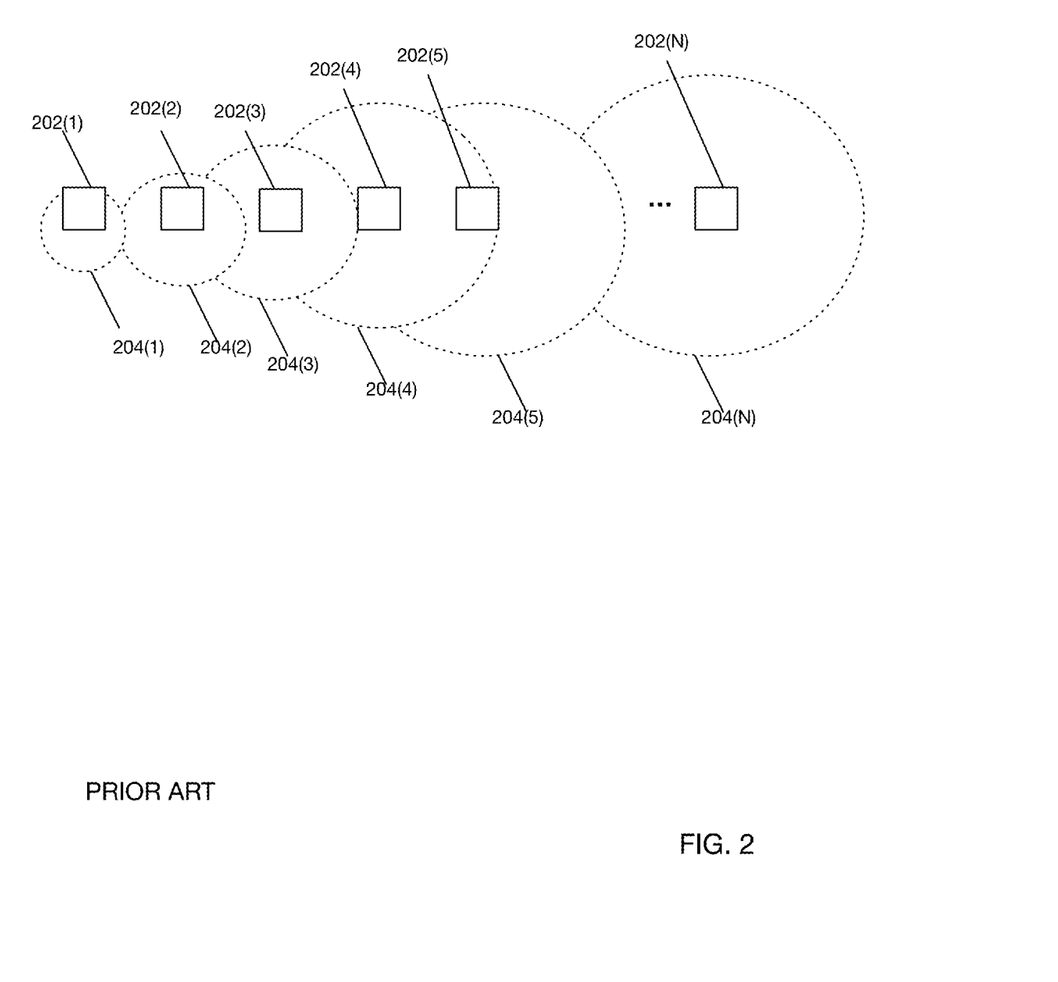
FIG. 2 illustrates a phased-array antenna scheme.

FIG. 2 illustrates a phased-array antenna scheme. A phased array of antennas 201(1)-202(N) is arranged such that the relative phases of the signals feeding the antennas 201(1)-202(N) are configured so that the effective radiation pattern of the array from the superposition of respective waves 204(1)-204(N) is reinforced in a desired direction and suppressed in undesired directions. Effectively a phased array of antennas acts like an N-slit diffraction and may be viewed as the coherent superposition of N line sources. Since each individual antenna acts as a slit emitting electromagnetic waves, the composite diffraction pattern of the array can be calculated by adding the phase shift φ to the fringing term.

Figure 3A:
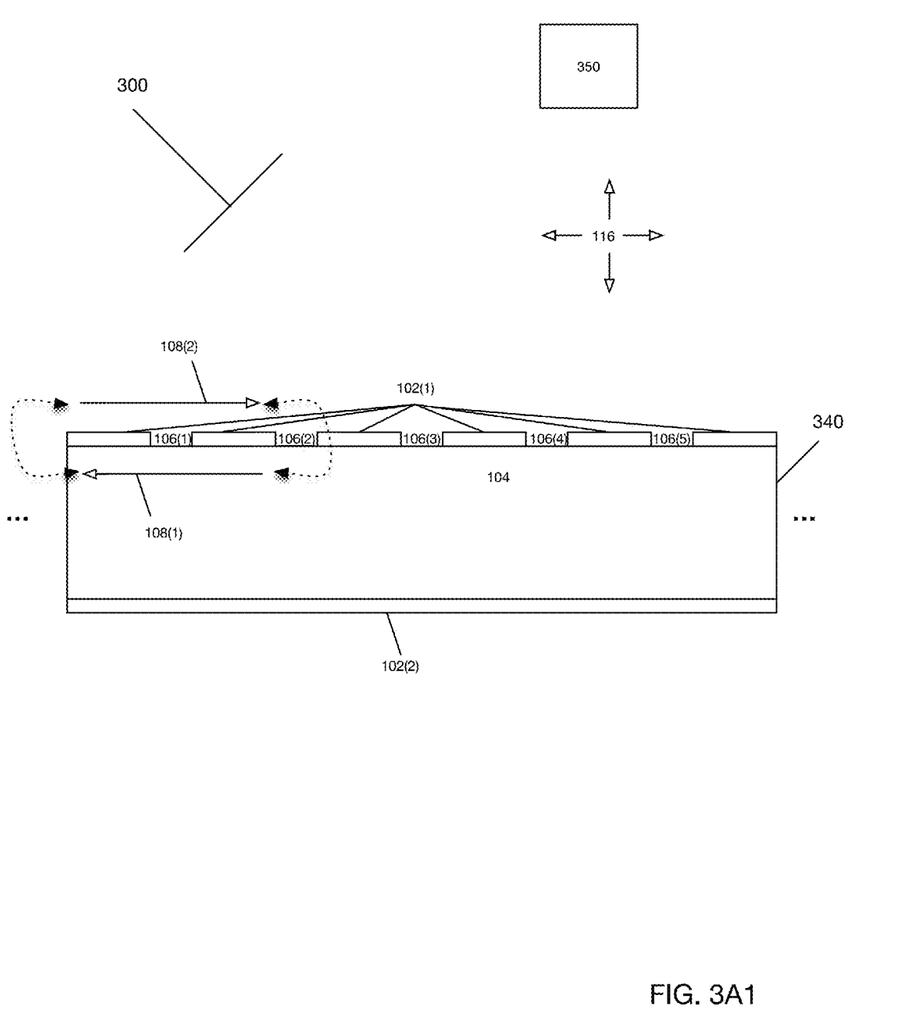

FIG. 3A1 illustrates a cross-section of a portion of a plasmonic laser, which is configured to establish a coupling between a first guided wave inside an optical cavity of the laser and a second guided wave outside the optical cavity of the laser according to one embodiment. As will be described in detail herein, a feedback scheme herein referred as an "antenna feedback" may be achieved due via introduction of a specific periodic perturbation in the cladding of the plasmonic laser. As such, FIG. 3A1 shows antenna feedback enabled plasmonic laser 300, which further comprises cladding 102(1) and 102(2), optical cavity 340, optical gain medium 104 and apertures 106(1)-106(5). According to one embodiment optical gain medium 104 may be a semiconductor. However, according to alternative embodiments, optical gain medium may be any other solid-state dielectric material that could amplify light at the laser's desired frequency.

FIG. 3A1 also shows exemplary apertures 106(1)-106(5). The function of such apertures 106(1)-106(5) will become evident as the invention is further described. However, in general apertures 106(1)-106(5) and their particular periodicity structure may be utilized to establish a coupling between first guided wave 108(1) inside cavity 340 and second guided wave 108(2) in surrounding medium 116. Although only apertures 106(1)-106(5) are shown in FIG. 3A, it is understood that antenna feedback enabled plasmonic laser 300 may utilize any number of apertures.

In general, it should be understood that apertures 106(1)-106(5) are merely representative of one particular embodiment. In general, any periodic perturbation structure such as a periodic grating of holes or slits could also be utilized to establish a coupling between guided waves 108(1) and 108(2). As described herein, the utilization of periodic perturbation structure such as apertures 106(1)-106(5) establishes a coupling between guided waves 108(1) and 108(2). In particular, this coupling may cause guided waves 108(1) and 108(2) to exhibit themselves as surface-plasmon polariton ("SPP") waves. The single-sided SPP waves 108(2) comprise the near-field of the plasmonic laser and have a large spatial extent in the surrounding medium. Since the far-field radiation pattern is the spatial Fourier-transform of the near-field of a radiation source, the far-field beam pattern of a plasmonic laser with antenna-feedback exhibits a narrow beam profile. Thus, the introduction of a specific perturbation periodicity such as by utilizing a well chosen grating period, a plasmonic laser may then be caused to radiate like an end-fire phased-array antenna for an excited DFB mode. Exemplary embodiments of choices for a well chosen periodicity to achieve the heretofore mentioned effect will be described below.

Further, it is understood that the invention may be practiced utilizing only a cladding on one face of antenna feedback enabled plasmonic laser 300, i.e., cladding 102(2) is optional. According to one embodiment, cladding 102(1) and 102(2) is composed of a metallic substance such as gold, copper, titanium, etc. or a layered combination of multiple such metals.

In more detail, according to one embodiment, a first guided electromagnetic wave 108(1) is established inside optical cavity 340 and a second guided electromagnetic wave 108(2) is established outside optical cavity 340. According to one embodiment, a coupling is established between guided electromagnetic waves 108(1) and 108(2) in the form of a phase-lock condition via the periodic structure of apertures 106(1)-106(5). According to one embodiment guided waves 108(1) and 108(2) are SPP waves. The establishment of a phase-lock condition facilitates the maintenance of SPP waves 108(1) and 108(2). Methods for establishing the phase-lock or coupling condition between SPP waves 108(1) and 108(2) in the form of a specific grating period are described below with respect to FIGS. 3B and 3C. As will become evident as the invention is further described, the establishment and maintenance of SPP waves 108(1) and 108(2) via such a coupling facilitates a narrow far-field beam pattern due to the fact that the near-field profile of the single-sided SPP waves in the surrounding medium of the cavity exhibits a large spatial profile.

Figure 3A:
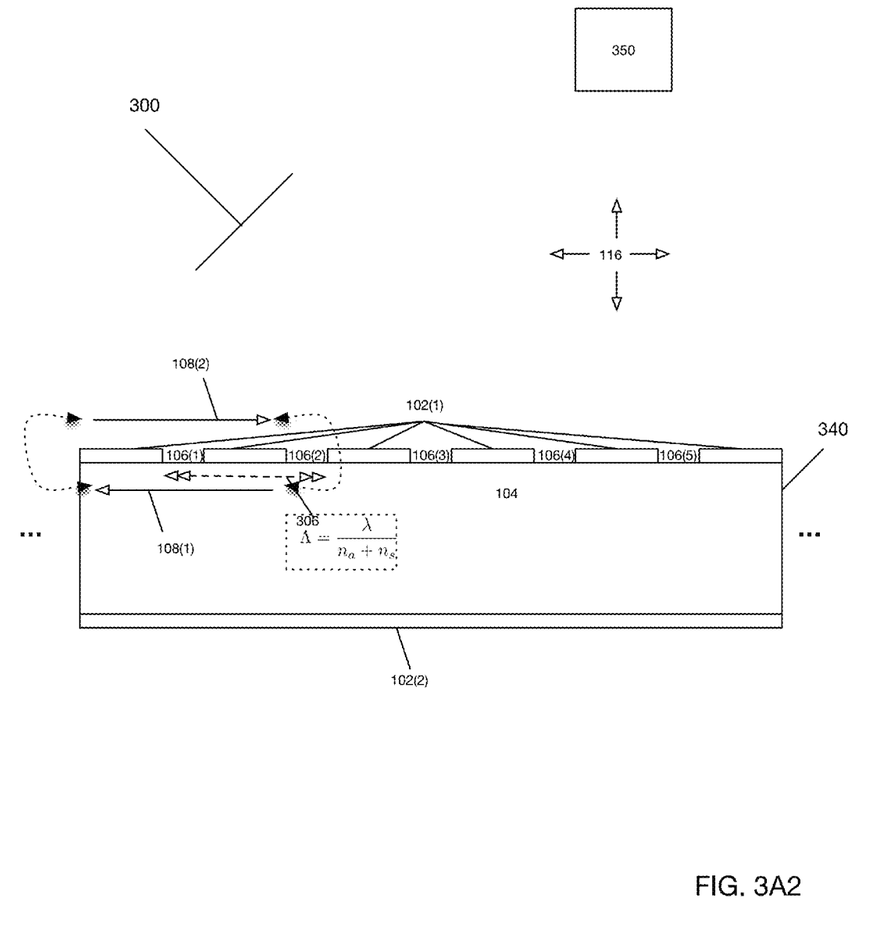

FIG. 3A2 illustrates a cross-section of a portion of a plasmonic laser that incorporates a feedback scheme herein referred as an "antenna feedback" according to one embodiment. Antenna feedback enabled plasmonic laser 300 further comprises optical cavity 340, cladding 102(1) and 102(2), optical gain medium 104 and apertures 106(1)-106(5). According to one embodiment optical gain medium 104 may be a semiconductor. However, according to alternative embodiments, optical gain medium 104 may be any other solid-state dielectric material that could amplify light at the laser's desired frequency. Although only apertures 106(1)-106(5) are shown in FIG. 3A1, it is understood that antenna feedback enabled plasmonic laser 300 may comprise any number of apertures. Further, it is understood that the invention may be practiced utilizing only a cladding on one face of antenna feedback enabled plasmonic laser 300, i.e., cladding 102(2) is optional. According to one embodiment, cladding 102(1) and 102(2) is composed of a metallic substance such as gold, copper, titanium, etc. or a layered combination of multiple such metals.

As shown in FIG. 3A2, antenna feedback enabled plasmonic laser 300 is enclosed in surrounding medium 116. According to one embodiment, surrounding medium 116 may comprise air, vacuum, or some other dielectric medium with low optical losses at the laser's emission frequency. Multiple types of media may also surround the laser's cavity, such as air on the top and sides of the cavity and a semiconductor substrate on the bottom of the cavity.

FIG. 3A2 also shows antenna feedback scheme 306, which according to one embodiment is a specific periodicity for apertures 106(1)-106(5). As shown in FIG. 3A2, this periodicity is described by the relation $$\Lambda = \frac{\lambda}{n_a + n_s},$$

where $\Lambda$ is the grating period, $\lambda$ is the free space wavelength corresponding to the propagating SPP waves inside the cavity and outside in the surrounding medium, $n_a$ is the effective propagation index in the active medium 104 and $n_s$ is the effective propagation index in surrounding medium 116.

As will become evident as the invention is further described, upon pumping of optical gain medium 104, antenna feedback scheme 306 establishes a phase matched coupling between first guided surface-plasmon polariton (SPP) electromagnetic wave established in the optical cavity 108(1) and second single-sided guided SPP wave 108(2) in the surrounding medium 116. As illustrated in FIG. 3A2, in contrast to conventional DFB methods such as those illustrated in FIGS. 1A-1C above in which periodic gratings couple forward and backward propagating waves inside active medium 104 itself, antenna-feedback scheme 306 couples a single-sided SPP wave 108(2) that travels in the surrounding medium with the SPP wave traveling inside the active medium 108(1).

A derivation of antenna feedback scheme 306 may be determined from a phase match condition and will now be derived. An incident electromagnetic wave propagating along a linear, one-dimensional grating suffers Bragg diffraction in multiple directions. Conservation of linear momentum requires that the incident wavevector $k_i$ and any given diffracted wavevector $k_d$ differ by integer multiples of the grating wavevector $$\frac{2\pi}{\Lambda}$$

such that:

$$k_i = p\frac{2\pi}{\Lambda} + k_d \qquad \text{(Eq. 1)}$$

where p is an integer (p=+/−1, +/−2, +/−3, . . . ) that specifies the diffraction order and $\Lambda$ is the period of the grating.

Since the SPP wave has maximum amplitude at the interface of metal and dielectric active medium in the cavity, a periodic perturbation in the metal film (such as in the form of apertures or slits) could provide strong Bragg diffraction up to high-orders (increasing p) for the counter-propagating SPP saves inside the active medium with incident and diffracted wavevectors $k_i$ and $k_d = -k_i$ respectively, such that:

$$2k_i = p\frac{2\pi}{\Lambda}$$

For plane-wave like modes at frequencies far away from the plasma resonance frequency in metal $$k_i \approx \frac{2\pi n_a}{\lambda}$$

where $n_a$ is effective propagation index of the guilded SPP wave inside the cavity and $\lambda$ is the free space wavelength corresponding to the resonant SPP waves. This is the case in conventional p-th order DFB gratings, which results in excitation of a DFB mode with $$\lambda = \frac{2n_a\Lambda}{p}$$

that corresponds to the emission wavelength from the single-mode DFB laser.

For the antenna feedback scheme, a different choice of grating period Λ is made, which results in an SPP wave inside active medium 104 with incident wavevector $$k_i \approx \frac{2\pi n_a}{\lambda}$$

diffracting in the opposite direction in the surrounding medium with wavevector $$k_d \approx -\frac{2\pi n_s}{\lambda}.$$

According to one embodiment, the strongest diffraction will be in the first-order (p=1) (which is the desired diffraction order for the antenna feedback), for which Eq. 1 results in $$\frac{2\pi n_a}{\lambda} = \frac{2\pi}{\Lambda} - \frac{2\pi n_s}{\lambda} \quad (\text{Eq. 2})$$

that leads to excitation of a DFB mode with $\lambda = (n_a + n_s)\Lambda$, which is different from any of the p-th order DFB modes that occur at $$\lambda = \frac{2 n_a \Lambda}{p}.$$

So long as all possible p-th order DFB modes (with strong diffraction efficiency) occur at wavelengths outside of the gain-bandwidth of the active medium (i.e. the wavelength region in which the active medium can amplify electromagnetic waves), and the antenna feedback mode occurs within the gain-bandwidth, the plasmonic laser will excite the desired antenna feedback mode leading to laser emission at $\lambda = (n_a + n_s)\Lambda$.

Antenna feedback scheme 306 may utilize a chosen periodicity of the grating such as that heretofore described. Such as chosen periodicity causes Bragg diffraction of an SPP wave traveling inside the cavity to generate an SPP wave traveling outside the cavity in the surrounding medium on the opposite side the metallic cladding. The same periodicity also ensures that a SPP wave attached to the metal cladding and travelling in the surrounding medium also undergoes a Bragg diffraction to generate an SPP wave traveling inside the cavity. This dual diffraction process serve to couple SPP waves inside and outside the cavity, thereby establishing distributed-feedback for the laser at the wavelength for which the phase-condition is satisfied. Correspondingly, resonant standing SPP waves are established both inside the cavity as well as in the surrounding medium (and attached to the metal-cladding) for the "antenna-feedback" mode.

An antenna-feedback mode corresponding to antenna feedback scheme 306 can always be excited by selecting an appropriate grating period Λ such that the wavelength occurs close to the peak-gain wavelength in the active-medium. Thus, according to one embodiment, antenna feedback scheme 306 is achieved by setting the grating period $$\Lambda = \frac{\lambda}{n_a + n_s}$$

where Λ is the grating period, $n_a$ is the effective propagation index in the active medium 104, $n_s$ is the effective propagation index in surrounding medium 116 and λ is the free-space wavelength corresponding to the SPP mode, which according to one embodiment may be close to the peak gain wavelength in active medium 104. For GaAs/AlGaAs based THz QCLs, for example, $n_a \approx 3.6$, $n_s \approx 1$, and hence for a chosen grating-period Λ, the first-order DFB, antenna-feedback and second-order DFB modes occur at wavelengths 7.2 Λ, 4.6 Λ and 3.6 Λ respectively. The typical gain-bandwidth of THz QCLs is less than 20% of the peak-gain wavelength, which suggests the grating period Λ could be chosen specifically to excite only the antenna feedback mode. This leads to robust excitation of the antenna feedback mode in the plasmonic laser.

The beam pattern from a phased-array antenna may be described as multiplication of (a) an 'array-factor', which describes the beam due to interference pattern of spherical waves emanating from each element of the array, and (b) an 'element-factor' which describes beam pattern due to a single element of the array. In the described antenna feedback scheme, the narrow beam is affected due to both array and element factors. The narrow array-factor is due to specific phase-condition between adjacent grating periods that leads to coherent combining of beams in the end-fire direction only. The narrow element-factor is due to the large spatial extent of the single-sides SPP wave that is generated in the surrounding medium. This is because a radiation source with large spatial extent causes a narrow beam output in the far-field.

According to one embodiment, SPP waves in the near-field of plasmonic laser 300 are of large broad spatial extent. Far-field radiation pattern 350 is the Fourier Transform of the near-field pattern. Accordingly, since the SPP near-field pattern is large in extent, the far-field radiation pattern is narrow leading to a narrow beam spread.

Figure 3B:
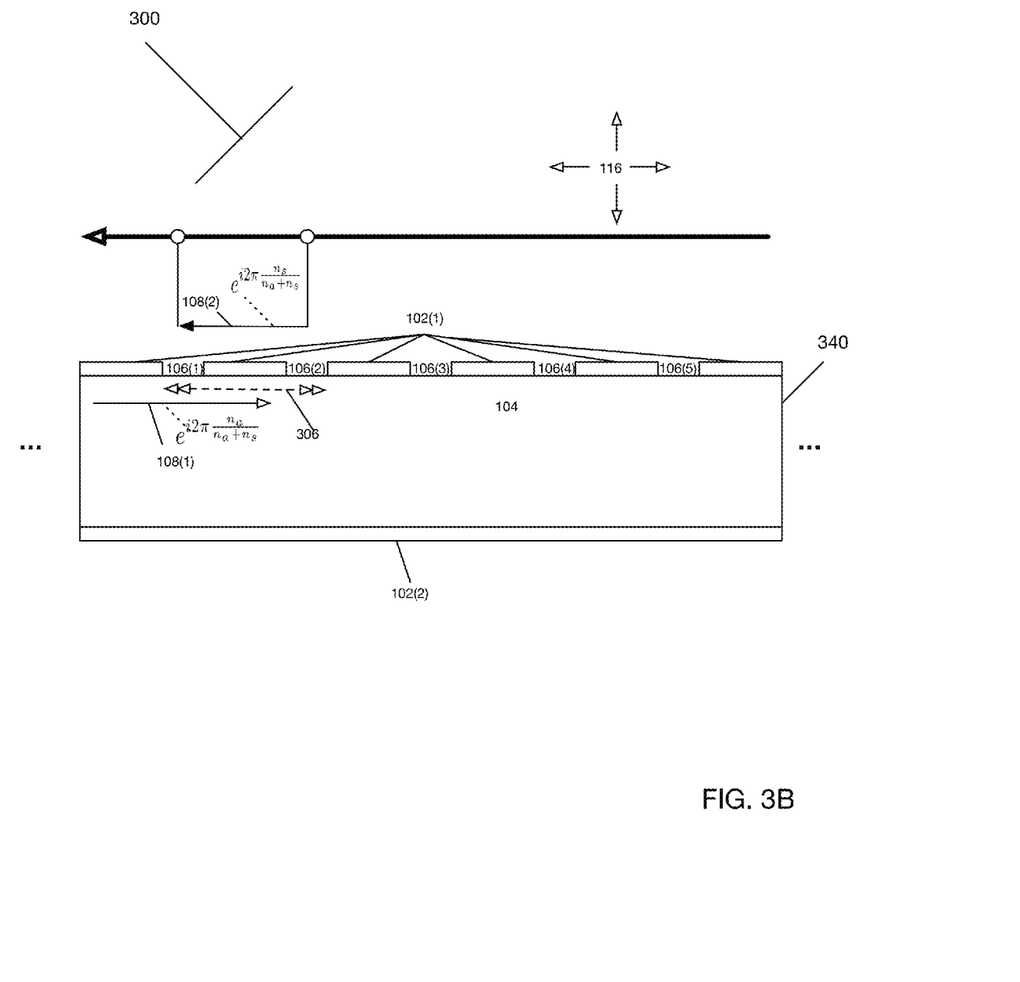
FIG. 3B further illustrates how an antenna feedback scheme employed in a plasmonic laser leads to a fixed phase-condition at each aperture between counter propagating SPP waves on either side of metal-cladding according to one embodiment. The fixed phasecondition is such that the combined round-trip phase for SPP waves propagating on either side of metal cladding is an integer multiple of a for a propagation length of one grating period Λ.
Figure 3C:
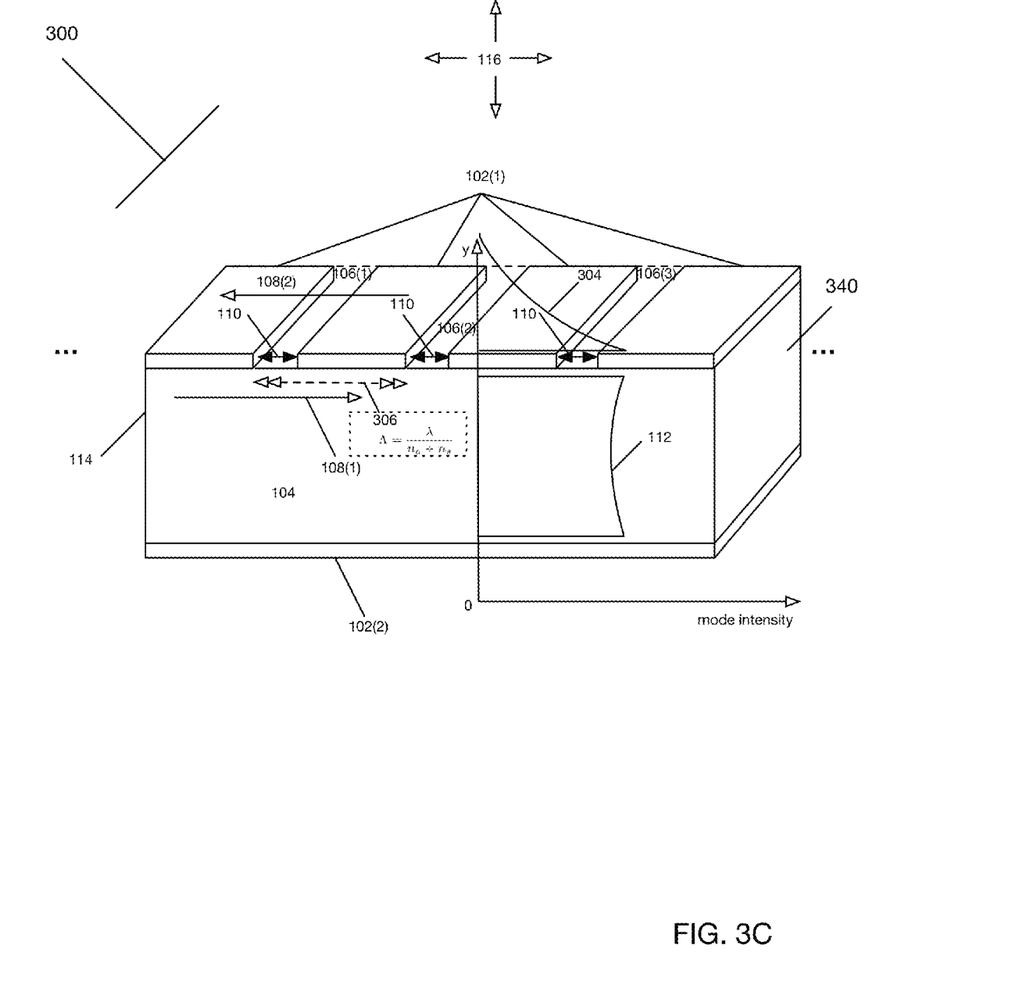
FIG. 3C illustrates how Bragg diffraction from each aperture (or from some other form of periodicity grating) in an antenna feedback scheme applied to a plasmonic laser adds constructively (in-phase) to couple to far-field radiation in the end-fire (z) direction according to one embodiment.

FIG. 3B further illustrates how an antenna feedback scheme employed in a plasmonic laser leads to a fixed phase-condition at each aperture between counter propagating SPP waves on either side of metal-cladding according to one embodiment. Antenna-feedback scheme 306 leads to excitation of a coherent single-sided SPP standing-wave 108(2) on the metallic cladding of plasmonic laser 300, which is phase-locked to the resonant-cavity SPP mode 108(1) inside the active medium. As shown in FIG. 3B, both waves maintain the exact same phase relation at each aperture location where they exchange electromagnetic (EM) energy with each other due to diffraction as shown in FIG. 3C. An SPP wave in surrounding medium 116 is excited due to scattering of the EM field at apertures 106(1)-106(5) that generates a combination of propagating quasi-cylindrical waves (also referred to as "creeping waves", see Lalanne et al. Surface Science Reports v. 64, p. 453 (2009)) and SPPs along the surface of cladding 102(1) in the surrounding medium 116.

FIG. 3C illustrates how emission from each aperture in an antenna feedback scheme applied to a plasmonic laser adds constructively to couple to far-field radiation in the end-fire (z) direction according to one embodiment. Scattered waves (not shown in FIG. 3C) at each aperture 106(1)-106(5) superimpose constructive in only the end-fire (z) direction (which is also known as the axis of the phased-array) owing to the phase condition established at each aperture 106(1)-106(5). This leads to significant build up of amplitude in the single-sided SPP waves in the surrounding medium 116 and propagating on cladding 102(1). For coupling to far-field radiation (not shown in FIG. 3C), the radiation is therefore like that from an end-fire phased array antenna that produces a narrow beam in both the x and y directions, since the beam adds constructively in the far-field only when propagating along the length of the laser cavity (i.e. the axis of the array of periodic apertures), much like an end-fire phased-array antenna. For THz QCLs, this is a significant improvement over recently developed third-order DFB methods for producing directional beams, since the antenna feedback scheme does not require any specific design considerations for phase matching like in Kao et al. Optics Letters v. 37, p. 2070 (2012), Hu et al. U.S. Pat. No. 9,036,674 B2 (2015).

Figure 4A:
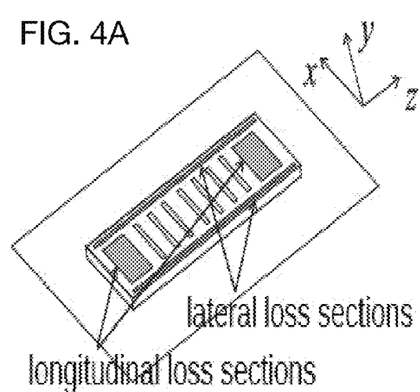
FIG. 4A depicts a schematic diagram of the cavity of an antenna feedback enabled plasmonic laser according to one embodiment. In this case, the depicted plasmonic laser is a THz quantum cascade laser (QCL).
Figure 4B:
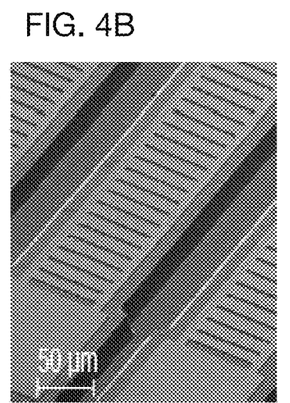
FIG. 4B is a scanning-electron microscope image of a fabricated antenna feedback enabled plasmonic laser, in this case a THz QCL, according to one embodiment.

FIG. 4A depicts a metallic cladding of an antenna feedback enabled plasmonic laser according to one embodiment. According to one embodiment, an active medium of 10 microns of thickness is employed and is based on a 3 THz GaAs/$Al_{0.10}Ga_{0.90}As$ QCL design. FIG. 4B is a scanning-electron microscope image of a fabricated antenna feedback enabled plasmonic laser according to one embodiment.

Figure 5:
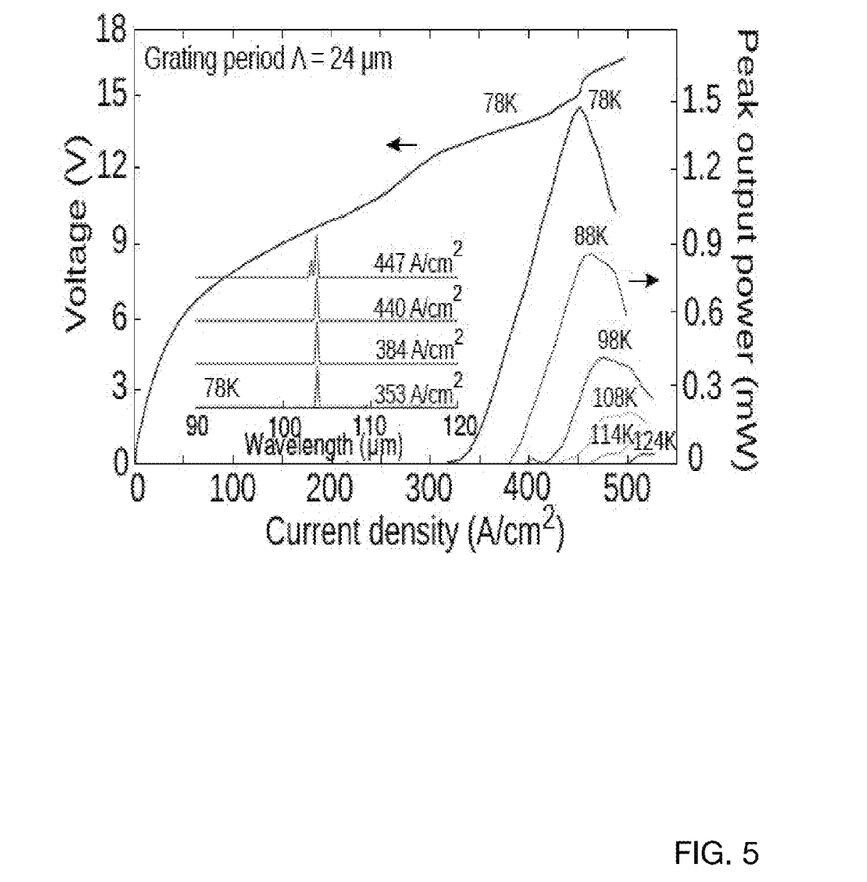
FIG. 5 is a plot of experiment light-current-voltage characteristics of an antenna-feedback QCL of dimensions 1.4 mm×100 microns at different heat-sink temperatures according to one embodiment.

FIG. 5 is a plot of experiment light-current-voltage characteristics of an antenna feedback enabled plasmonic laser of dimensions 1.4 mm×100 microns at different heat-sink temperatures according to one embodiment. The light-current-voltage characteristics shown in FIG. 5 pertain to a feedback enabled plasmonic laser biased with low duty-cycle current pulses of 200 ns duration and 100 kHz repetition rate up to a temperature of 124 K. The inset in FIG. 5 shows lasing spectra for different biases where the spectral linewidth is limited by the instrument's resolution. According to one embodiment peak-power output of ~1.5 mW was detected from the antenna feedback enabled plasmonic laser. For comparison, a terahertz QCL with third-order DFB and similar dimensions was also fabricated on the same chip, which operated up to a similar temperature of ~124K and emitted peak-power output of ~0.45 mW. The antenna-feedback gratings led to greater radiative out-coupling compared to conventional DFB schemes for terahertz QCLs.

Figure 6:
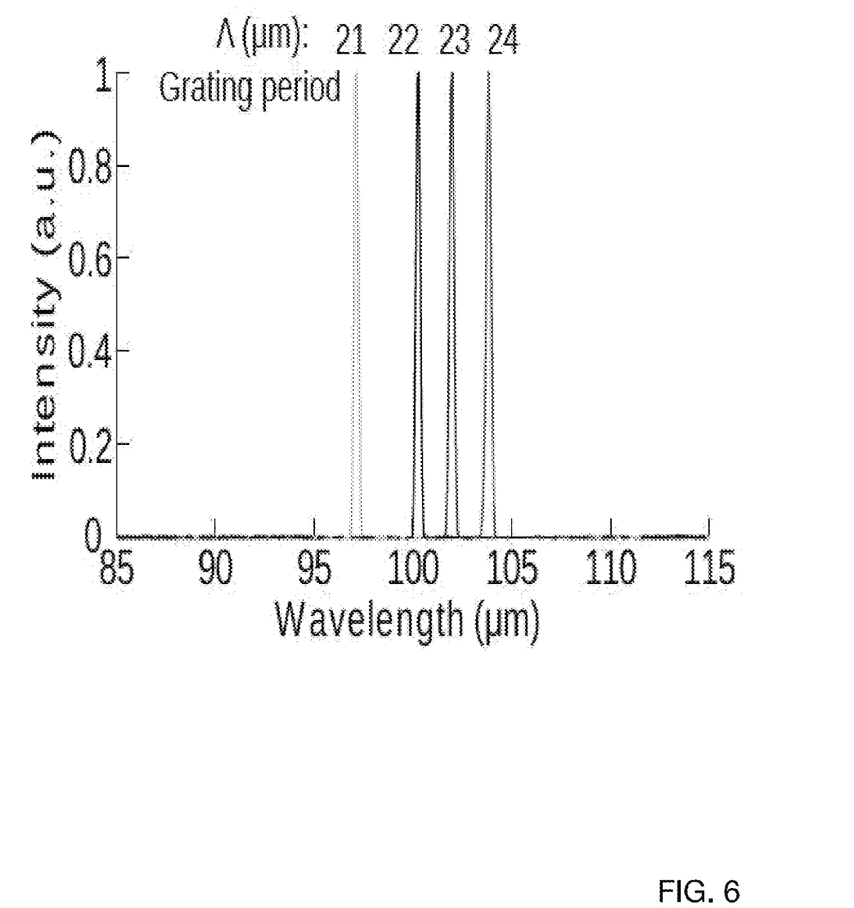
FIG. 6 is a plot of experimental spectra for four different antenna-feedback QCLs with varying grating periods but similar overall cavity dimensions biased at a current density of ~440 A/cm² at 78K according to one embodiment.

FIG. 6 is a plot of experimental spectra for four different antenna-feedback QCLs with varying grating periods but similar overall cavity dimensions biased at a current density of ~440 $A/cm^2$ at 78K according to one embodiment. As shown in FIG. 6, the single-mode spectra scale linearly with Λ, which evidences that the feedback mechanism works as expected and the desired DFB mode is selectively excited in each case.

Figure 7A:
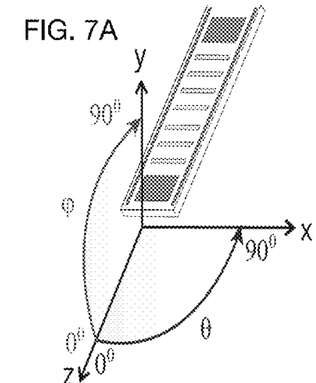
FIG. 7A is a schematic showing an orientation of an antenna-feedback QCL and definition of angles with respect to measurement of far field beam patterns for the antenna-feedback QCL according to one embodiment.

FIG. 7A is a schematic showing an orientation of an antenna-feedback QCL and definition of angles with respect to measurement of far field beam patterns for the antenna-feedback QCL according to one embodiment.

Figure 7B:
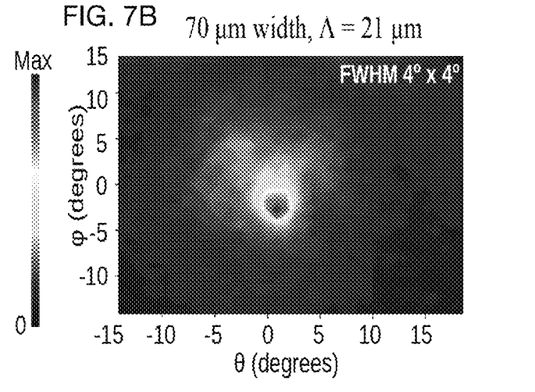
FIG. 7B shows a plot of a far field beam pattern for an antenna-feedback QCL with a 70 µm width and Λ=21 µm according to one embodiment.

FIG. 7B shows a plot of a far field beam pattern for an antenna-feedback QCL with a 70 μm width and Λ=21 μm according to one embodiment. Referring to FIG. 7B, the full-width half-maximum ("FWHM") for an antenna-feedback QCL with these parameters was found to be ~4°×4°, which is the narrowest reported beam-profile for any terahertz QCL reported to date. In contrast, previous schemes for emission in a narrow-beam have resulted in divergence angles of 6°×11°, using very long (>5 mm) cavities and a phased-matched third-order DFB scheme and 7°×10°, using broad-area devices with 2D photonic-crystals for single-mode terahertz QCLs, and 4°×10°, and 12°×16°, for multi-mode QCLs using metamaterial collimators.

Figure 7C:
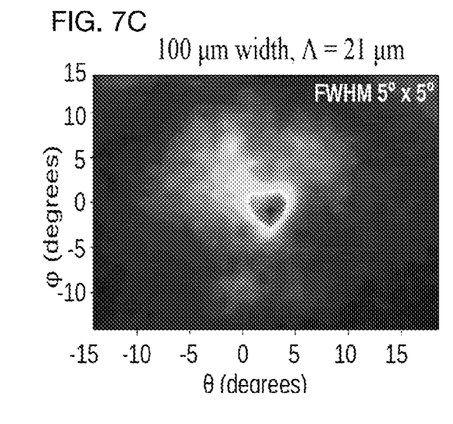
FIG. 7C shows a plot of a far field beam pattern for an antenna-feedback QCL with a 100 µm width and Λ=21 µm according to one embodiment.

FIG. 7C shows a plot of a far field beam pattern for an antenna-feedback QCL with a 100 μm width and Λ=21 μm according to one embodiment.

Figure 7D:
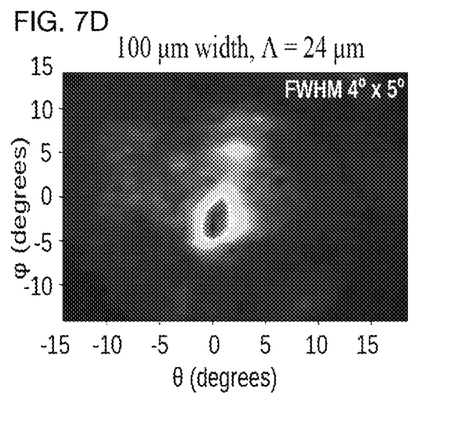
FIG. 7D shows a plot of a far field beam pattern for an antenna-feedback QCL with a 100 µm width and Λ=24 µm according to one embodiment.

FIG. 7D shows a plot of a far field beam pattern for an antenna-feedback QCL with a 100 μm width and Λ=24 μm according to one embodiment.

Comparing FIGS. 7C-7D, it can be observed that the beam divergence is relatively independent of Λ as expected. Further, these plots show that wider cavities result in a slightly broader beam.

An antenna-feedback scheme to achieve single-mode operation and a highly directional far-field radiation pattern from plasmonic lasers with subwavelength apertures and Fabry-Perot type cavities has been demonstrated. Such an antenna-feedback QCL can be achieved by perforating the metal film in the plasmonic laser with a periodic grating of holes or slits, which is relatively easy to implement for fabrication. A specific grating period is introduced, which leads to the plasmonic laser radiating like an end-fire phased-array antenna for an excited DFB mode.

Additionally, coherent single-sided SPPs are also generated on the metal film that have a large spatial extent in the surrounding medium of the plasmonic laser's cavity, which could have important implications for applications in integrated plasmonics. Coherent SPPs with large spatial extent could facilitate coupling of SPP waves from the plasmonic lasers to other photonic components, and could also potentially be utilized for plasmonic sensing.

Experimentally, the scheme described herein may be implemented in terahertz QCLs with metallic cavities. A beam-divergence angle as small as 4°×4° was achieved for single-mode QCLs, which is significantly narrower that that achieved with any other previously reported schemes for terahertz QCLs with periodic photonic structures.

Terahertz QCLs with antenna-feedback could lead to development of new modalities for terahertz spectroscopic sensing and wavelength tunability due to access of a coherent terahertz SPP wave on top of the QCL's cavity, possibilities of sensing and imaging at standoff distances of few tens of meters, and development of integrated terahertz laser arrays with a broad spectral coverage for applications in terahertz absorption spectroscopy The antenna-feedback scheme designed herein yields a myriad of applications related to tuning and sensing with plasmonic lasers, as well as integrated photonics applications with such lasers. The coherent SPP mode generated in surrounding medium 116 of the plasmonic laser has a large spatial extent could make it easy to couple SPP waves from the laser to other photonic components on a semiconductor chip in an integrated optics context. Typically, a laser's resonant-optical mode in the cavity is inaccessible for integrated sensing. However, the antenna-feedback scheme allows easy physical access of the resonant mode of the laser cavity due to its spatial extent in the surrounding medium of the cavity. Since the DFB frequency is dependent on the refractive index of the surrounding medium, a plasmonic sensing application could be devise in which the material or phenomenon to be sensed could be placed in proximity of the laser that changes the surrounding medium's refractive index, and hence the laser's emission frequency. The ability to alter the emission frequency of plasmonic laser in this straightforward manner could lead to applications in plasmonic sensing of different materials and tuning of the emission frequency of the plasmonic laser as well as a host of other possibilities.

What is claimed is:

1. A plasmonic laser comprising:
   an optical cavity enclosed in a surrounding medium;
   a metallic cladding surrounding the optical cavity;
   an optical gain medium enclosed in the cavity; and
   a periodic structure implemented in at least one of the cladding and the optical cavity, wherein the periodic structure is determined from a phase match condition, such that upon pumping of the gain medium a coupling is established between a first guided electromagnetic wave in the optical cavity and a second guided electromagnetic wave in the surrounding medium.

2. The plasmonic laser according to claim 1, wherein the first and second guided waves are surface-plasmon-polaritons ("SPPs").

3. The plasmonic laser according to claim 1, wherein the coupling between the first and second guided waves establishes a phase lock between the waves.

4. The plasmonic laser according to claim 3, wherein the periodic structure comprises a grating in the cavity, which facilitates the coupling.

5. The plasmonic laser according to claim 4, wherein the grating diffracts the first guided wave due to generate the second guided wave.

6. The plasmonic laser according to claim 5, wherein the grating has a period determined by the phase match condition between the first guided wave and the second guided wave.

7. The plasmonic laser according to claim 1, wherein the phase match condition is $$k_i = p\frac{2\pi}{\Lambda} + k_d$$

wherein $K_1$ is a wave number of an incident wave, $k_d$ is a wave number of a diffracted wave, p is an integer specifying a diffraction order (p=+/−1, +/−2, +/−3 . . . ) and $\Lambda$ is the period of the grating.

8. The plasmonic laser according to claim 1, wherein the cavity is a Fabry-Pérot cavity.

9. The plasmonic laser according to claim 1, wherein the second guided wave is generated by Bragg diffraction.

10. The plasmonic laser according to claim 1, wherein the second guided wave further comprises a propagating quasi-cylindrical wave.

11. A method for generating a narrow beam in a plasmonic laser comprising:
    introducing a periodic structure determined from a phase match condition in a boundary separating an optical cavity and a surrounding medium; and
    pumping the optical cavity, wherein a phase coupling is established between a first guided electromagnetic wave generated in the optical cavity and a second guided electromagnetic wave generated in the surrounding medium.

12. The method according to claim 11, wherein the first and second guided waves are surface-plasmon-polaritons ("SPPs").

13. The method according to claim 11, wherein the periodic structure comprises a grating further comprising a plurality of apertures.

14. The method according to claim 13, wherein the grating diffracts a first guided wave due to the periodic perturbation to generate the second guided wave.

15. The method according to claim 11, wherein the phase match condition is $$k_i = p\frac{2\pi}{\Lambda} + k_d \quad k_i = p\frac{2\pi}{\Lambda} + k_d$$

wherein $k_i$ is a wave number of an incident wave, $k_d$ is a wave number of a diffracted wave, p is an integer specifying a diffraction order (p=+/−1, +/−2, +/−3 . . . ) and $\Lambda$ is a period of the grating.

* * * * *